United States Patent
Zhu et al.

(10) Patent No.: US 9,588,203 B2
(45) Date of Patent: Mar. 7, 2017

(54) APPARATUS, METHOD AND COMPUTER-ACCESSIBLE MEDIUM FOR DETERMINATION OF ELECTRICAL PROPERTIES OF TISSUES AND MATERIALS USING MULTIPLE RADIO FREQUENCY MEASUREMENTS

(75) Inventors: Yudong Zhu, Scarsdale, NY (US); Daniel K. Sodickson, Larchmont, NY (US)

(73) Assignee: New York University, New York, NY (US)

( * ) Notice: Subject to any disclaimer, the term of this patent is extended or adjusted under 35 U.S.C. 154(b) by 898 days.

(21) Appl. No.: 13/313,808

(22) Filed: Dec. 7, 2011

(65) Prior Publication Data
US 2012/0146637 A1    Jun. 14, 2012

Related U.S. Application Data

(60) Provisional application No. 61/420,684, filed on Dec. 7, 2010.

(51) Int. Cl.
*G01R 33/48* (2006.01)
(52) U.S. Cl.
CPC .................................. *G01R 33/48* (2013.01)
(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 4,689,563 A * | 8/1987 | Bottomley et al. ........... 324/309 |
| 4,694,254 A * | 9/1987 | Vatis et al. .................... 324/309 |
| 5,031,624 A * | 7/1991 | Mistretta et al. ............. 600/419 |
| 5,270,654 A * | 12/1993 | Feinberg et al. ............. 324/309 |
| RE35,656 E * | 11/1997 | Feinberg et al. ............. 324/309 |
| 6,873,153 B2 * | 3/2005 | Frydman ...................... 324/307 |
| 6,989,673 B2 * | 1/2006 | Zhu ............................... 324/318 |
| 7,075,301 B2 * | 7/2006 | Zhu ............................... 324/318 |
| 7,271,588 B2 * | 9/2007 | Frydman ...................... 324/318 |
| 7,382,129 B2 * | 6/2008 | Mills ............................. 324/318 |
| 7,633,293 B2 * | 12/2009 | Olson et al. .................. 324/318 |
| 7,800,368 B2 * | 9/2010 | Vaughan et al. ............. 324/318 |
| 7,999,545 B2 * | 8/2011 | Ullmann ....................... 324/314 |
| 8,026,721 B2 * | 9/2011 | Sodickson ......... G01R 33/3415 324/309 |
| 8,148,985 B2 * | 4/2012 | Zelinski et al. .............. 324/309 |
| 8,200,309 B2 * | 6/2012 | Wollin ................... G01R 33/28 600/407 |
| 8,228,062 B2 * | 7/2012 | Sharp et al. .................. 324/309 |

(Continued)

*Primary Examiner* — Melissa Koval
*Assistant Examiner* — Tiffany Fetzner
(74) *Attorney, Agent, or Firm* — Andrews Kurth Kenyon LLP

(57) ABSTRACT

An assembly for determining at least one electrical property of an object. The assembly includes at least one transmitter that can generate a plurality of electromagnetic field distribution patterns directed at an object. The assembly also includes a data apparatus with an MRI apparatus and a data processor. The MRI apparatus can produce at least one image of the object using a magnitude or a phase modulated by the electromagnetic field distribution patterns. The processor can then process data associated with the object to determine the at least one electrical property the object.

19 Claims, 3 Drawing Sheets

(56) References Cited

U.S. PATENT DOCUMENTS

| | | | |
|---|---|---|---|
| 8,319,496 B2* | 11/2012 | Eryaman et al. | 324/309 |
| 8,405,395 B2* | 3/2013 | Setsompop et al. | 324/309 |
| 8,508,224 B2* | 8/2013 | Schneider et al. | 324/309 |
| 8,604,791 B2* | 12/2013 | Vaughan et al. | 324/318 |
| 8,736,265 B2* | 5/2014 | Boernert et al. | 324/309 |
| 8,929,970 B2* | 1/2015 | Wollin | G01R 33/28 600/407 |
| 2004/0027127 A1* | 2/2004 | Mills | 324/317 |
| 2005/0007111 A1* | 1/2005 | Frydman | 324/307 |
| 2005/0052182 A1* | 3/2005 | Wollin | G01R 33/28 324/307 |
| 2005/0110487 A1* | 5/2005 | Zhu | 324/309 |
| 2005/0134267 A1* | 6/2005 | Zhu | 324/309 |
| 2005/0134275 A1* | 6/2005 | Frydman | 324/321 |
| 2008/0088305 A1* | 4/2008 | Olson et al. | 324/309 |
| 2008/0129298 A1* | 6/2008 | Vaughan et al. | 324/322 |
| 2010/0066362 A1* | 3/2010 | Ullmann | 324/309 |
| 2010/0134105 A1* | 6/2010 | Zelinski et al. | 324/309 |
| 2010/0171499 A1* | 7/2010 | Sharp et al. | 324/318 |
| 2010/0213939 A1* | 8/2010 | Sodickson | G01R 33/3415 324/309 |
| 2010/0253336 A1* | 10/2010 | Schneider et al. | 324/309 |
| 2010/0253338 A1* | 10/2010 | Eryaman et al. | 324/309 |
| 2010/0256480 A1* | 10/2010 | Bottomley et al. | 600/411 |
| 2011/0254548 A1* | 10/2011 | Setsompop et al. | 324/309 |
| 2012/0032678 A1* | 2/2012 | Vaughan et al. | 324/318 |
| 2012/0062230 A1* | 3/2012 | Vaughan et al. | 324/318 |
| 2012/0112748 A1* | 5/2012 | Hetherington et al. | 324/318 |
| 2012/0146637 A1* | 6/2012 | Zhu et al. | 324/307 |
| 2012/0212375 A1* | 8/2012 | Depree, IV | H01Q 15/0086 343/700 MS |
| 2012/0223712 A1* | 9/2012 | Wollin | G01R 33/28 324/309 |
| 2015/0247906 A1* | 9/2015 | Wollin | G01R 33/28 600/411 |

* cited by examiner

Figure 1
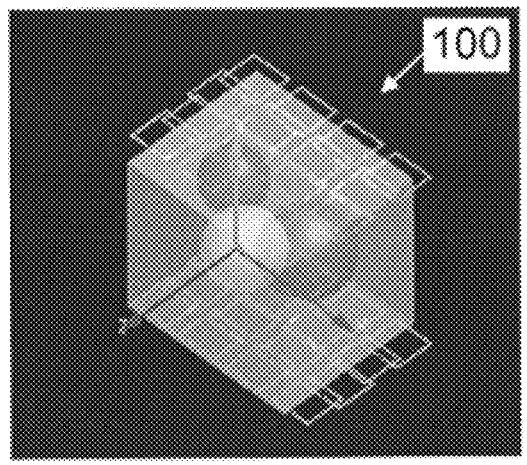
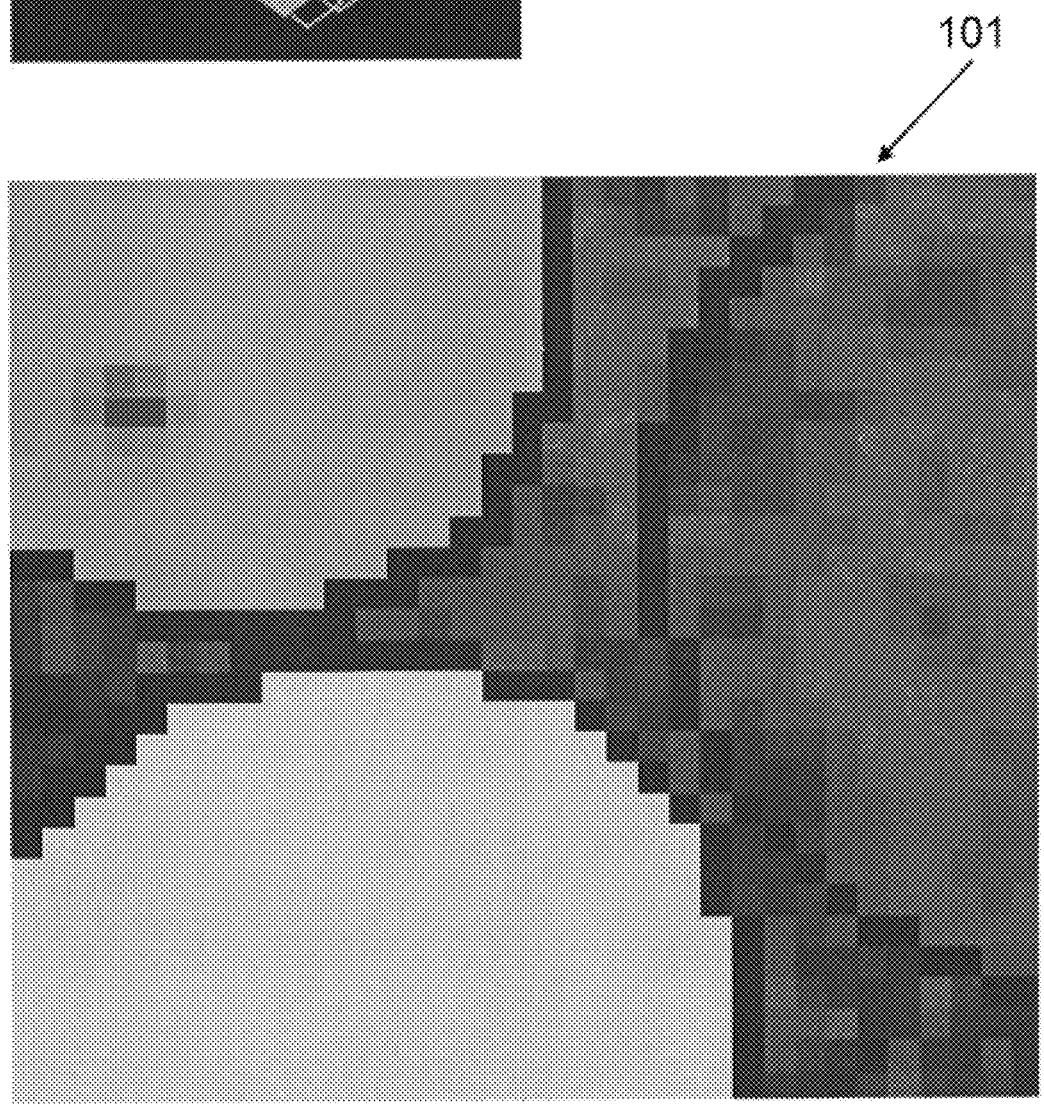

APPARATUS, METHOD AND COMPUTER-ACCESSIBLE MEDIUM FOR DETERMINATION OF ELECTRICAL PROPERTIES OF TISSUES AND MATERIALS USING MULTIPLE RADIO FREQUENCY MEASUREMENTS

CROSS-REFERENCE TO RELATED APPLICATION(S)

This application claims priority to U.S. Provisional Application Ser. No. 61/420,684, filed on Dec. 7, 2010, the disclosure of which is incorporated by reference herein in its entirety.

FIELD OF THE DISCLOSURE

The present disclosure relates to mapping electrical properties of tissues, and more specifically to an apparatus, method, and computer-accessible medium for a noninvasive mapping of electrical properties of materials using multiple radio frequency ("RF") measurements.

BACKGROUND INFORMATION

The prospect of noninvasive mapping of electrical properties of tissues and materials has long been contemplated by scientists. A robust determination of a spatial distribution of electrical conductivity and permittivity can facilitate a wide range of applications in a similarly wide range of fields, from clinical diagnostics to materials science.

Modern imaging modalities have provided a wealth of information about the structure and function of body tissues, both in health and in disease. However, despite the broad array of contrast mechanisms available and the abundance of scientific and diagnostic imaging applications, the underlying electrical properties of tissues in their intact in vivo state have remained largely invisible. Magnetoencephalography or electrocardiography techniques can track an intrinsic electrical activity in the brain or the heart, albeit at coarse spatial resolution. Nonetheless, tissues can be electromagnetic entities, with varying abilities to carry currents and store charges. The ability of heterogeneous tissues to respond to externally applied electromagnetic fields can dictate the success of therapeutic interventions such as transcranial magnetic stimulation or radiofrequency ablation; interactions of electromagnetic fields with the body can distort images obtained with high-field magnetic resonance imaging (MRI) scanners, limiting the practical use of these powerful devices; and invasive measurements have demonstrated that the electrical properties of tumors, for example, can differ dramatically from those of healthy tissue. Indeed, in the field of biomedical imaging, noninvasive electrical property mapping would provide a new tool for the detection and characterization of tumors, while at the same time, a detailed knowledge of electrical properties in vivo would enable both correction of distortions and accurate monitoring and control of patient-specific local energy deposition in high-field MRI. The concept of a "comprehensive electromagnetic superscanner" combining MRI and electrical property mapping has recently been described.

A variety of techniques for the electrical property imaging (or, equivalently, impedance imaging) have been previously described, but each such prior technique has its own notable limitations which have so far prevented widespread use. These techniques may be classified according to two complementary criteria: a) use of injected currents versus applied fields, and b) reliance upon surface measurements versus interior data. Electrical Impedance Tomography (EIT) represents the canonical surface-based technique using injected currents. Alternative surface-based techniques which avoid direct application of currents include Magnetic Induction Tomography (MIT), noise tomography, and Radiofrequency Impedance Mapping (RFIM). All such electrical prospection techniques require the solution of ill-posed inverse problems, which carry with them fundamental challenges of robustness, spatial resolution, etc. Once it was recognized that MRI may be used as a probe of the internal distribution of currents and magnetic fields, however, new techniques for impedance mapping began to emerge, including the injected-current-based MREIT approach, and the field-based electrical property tomography (EPT) technique. These techniques can circumvent the fundamental limitations of surface-based inverse problems, but they contend with the fact that MRI generally provides only partial information about interior currents and fields.

Thus, there remains a need for noninvasive mapping apparatus, systems and computer-accessible medium of the electrical properties of materials that can expand the capabilities of nondestructive testing. Such apparatus, systems and computer-accessible mediums can have potential applications in manufacturing, geology, archaeology, forensics, diagnostics, etc.

SUMMARY OF EXEMPLARY EMBODIMENTS

According to an exemplary embodiment of the present disclosure, an assembly for determining at least one electrical property of an object can be provided. The exemplary apparatus can include at least one transmitter configured to generate a plurality of electromagnetic field distribution patterns directed at an object; and a magnetic resonance imaging ("MRI") apparatus configured to produce at least one image of the object using at least one of a magnitude or a phase modulated by the electromagnetic field distribution patterns. Further, the assembly can be configured to process data associated with the object to determine the at least one electrical property of the object.

The transmitter of the exemplary assembly can include at least one radio frequency ("RF") coil. Further, the RF coil can include: (1) a plurality of RF coils disposed at a plurality of locations; or (2) an RF coil sequentially disposed at a plurality of locations. The RF coil can include at least one RF transmit coil and at least one RF receive coil.

Additionally, the transmitter can include at least one of: (1) a plurality of RF current-inducing leads disposed at a plurality of locations; or (2) an RF current-inducing lead sequentially disposed at a plurality of locations. Transmitter of the exemplary assembly can also include a passive field-altering object sequentially placed at a plurality of locations.

According to another embodiment of the present disclosure, a method of mapping at least one electrical property of an object can be provided. The exemplary method can include generating a plurality of electromagnetic field patterns; generating a plurality of MR images with at least one of a magnitude or a phase associated with the generated electromagnetic field patterns; generating a plurality of relationships relating the MR images to the electromagnetic field patterns, and to the at least one electrical property the object; and resolving the relationships for the at least one electrical property.

According to yet another embodiment of the present disclosure a non-transitory computer readable medium including instructions thereon that are accessible by a hardware processing arrangement can be provided. When the processing arrangement executes the instructions, the processing arrangement is configured to generate a plurality of electromagnetic field patterns; generate a plurality of MR images with at least one of a magnitude or a phase associated with the generated electromagnetic field patterns; generate a plurality of relationships relating the MR images to the electromagnetic field patterns, and to the at least one electrical property the object; and resolve the relationships for the at least one electrical property.

These and other objects, features and advantages of the exemplary embodiment of the present disclosure will become apparent upon reading the following detailed description of the exemplary embodiments of the present disclosure, when taken in conjunction with the appended claim.

BRIEF DESCRIPTION OF THE DRAWINGS

Exemplary objects, features and advantages of the present disclosure will become apparent from the following detailed description taken in conjunction with the accompanying Figures showing illustrative embodiments of the present disclosure, in which:

FIG. 1 is an illustration of an exemplary simulation and mapping obtained utilizing an exemplary embodiment of the present disclosure;

Figure 2:
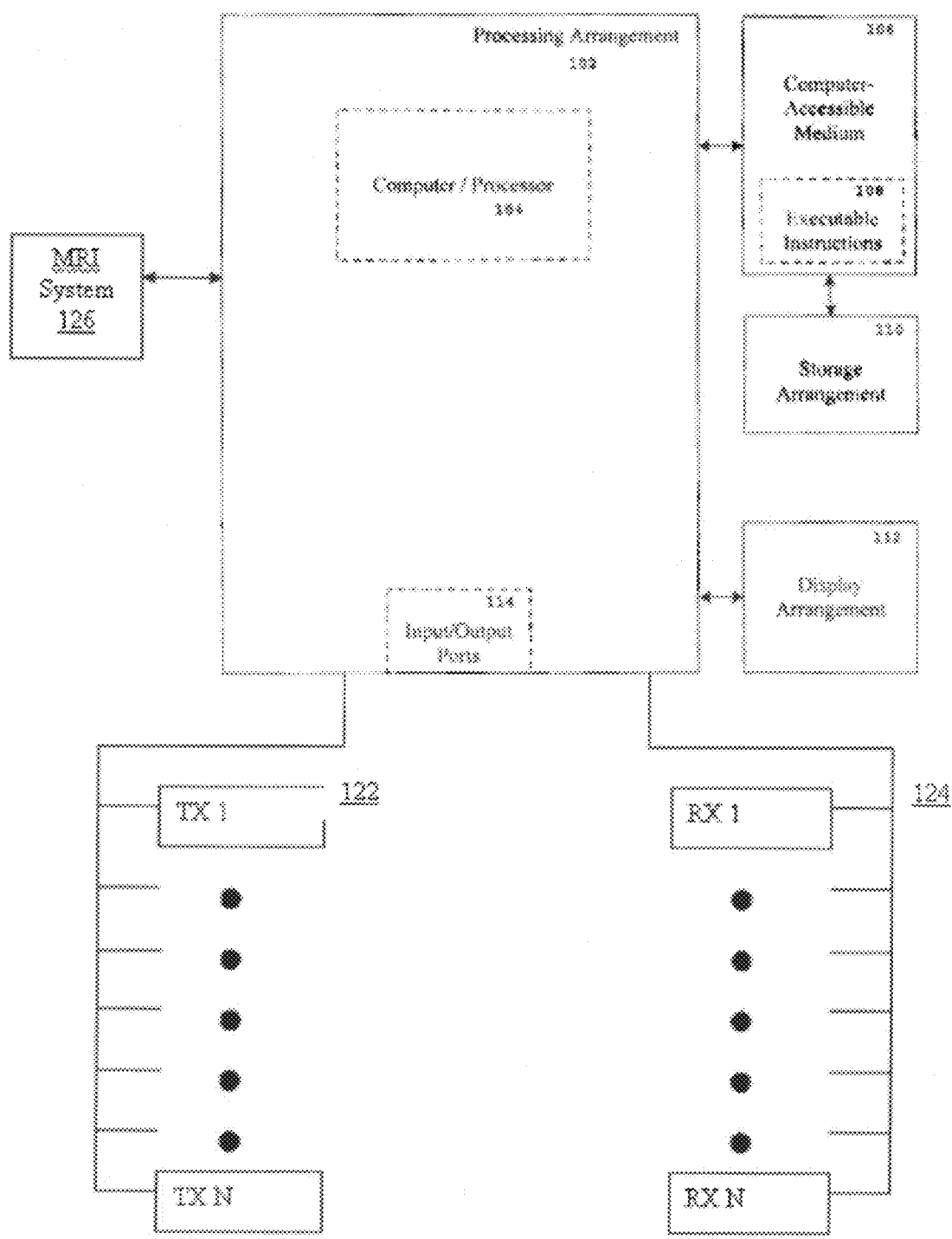
FIG. 2 is a block diagram of an exemplary embodiment of a system according to the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures or the claims appended herewith.

DETAILED DESCRIPTION OF EXEMPLARY EMBODIMENTS

Spatial variations of radio-frequency ("RF") fields can carry information about the spatial distributions of electrical properties (e.g., conductivity and permittivity) within an imaged object. To extract such information with non-invasive MR means, Maxwell equations can be transformed to arrive at a subset of equations relating RF transmit field and RF receive field to electrical properties:

$$\xi(x)B_1^+(x)=\nabla^2 B_1^+(x)+\text{higher order terms} \quad (1)$$

and $$\xi(x)^*B_1^-(x)=\nabla^2 B_1^-(x)+\text{higher order terms} \quad (2)$$

In Eqns. 1 and 2 x can be the spatial coordinate vector, * can denote complex conjugate, $B_1^+$ and $B_1^-$ can be phasor representations of, respectively, the time-harmonic radio-frequency transmit and receive fields, and $\xi(x)$ can represent $(\sigma(x)+\sqrt{-1}\omega\epsilon(x))\sqrt{-1}\omega\mu(x)$, a composite quantity that can be composed of angular frequency ($\omega$) as well as such electrical properties as conductivity ($\sigma$), permittivity ($\epsilon$) and permeability ($\mu$). The higher order terms can involve spatial derivatives of electrical properties, and tend to vanish when the properties vary slowly in space. Typically, the higher the frequency at which an MR experiment is conducted, the stronger the impact the electrical property distributions tend to exert on the spatial variations of RF fields.

Unlike some alternative approaches to electrical property mapping, the derivation leading to Eqns. 1 and 2 typically does not rely on assumptions beyond Maxwell equations. Further, when the higher order terms are negligible, the two equations can involve RF transmit and receive field quantities. Because of relatively robust MR-based techniques that map RF transmit field using spin flip angles, non-invasive mapping of RF transmit field quantities can be more manageable than that of other electromagnetic field quantities. Eqn. 1 or Eqn. 2 can point to a more accurate/practical method for electrical property mapping. The Laplace's differential operator can be local and the higher order terms can be negligible in regions of slowly varying electrical property. This can give rise to local calculation of electrical properties:

$$\xi(x)=\nabla^2 B_1^+(x)/B_1^+(x) \quad (3)$$

or $$\xi(x)=\text{complex conjugate}(\nabla^2 B_1^-(x)/B_1^-(x)) \quad (4)$$

In an exemplary embodiment of the present disclosure, where a map of $B_1^+$ field with a sufficiently fine spatial resolution is available, for any voxel non-adjacent to a boundary between materials of substantially different properties, a discretized approximation of the Laplacian can be used as follows and can give electrical properties:

$$\xi_{p,q,r} = \left[\left(\begin{array}{c} b_{p+1,q,r} + b_{p-1,q,r} + b_{p,q+1,r} + \\ b_{p,q-1,r} + b_{p,q,r+1} + b_{p,q,r-1} - 6b_{p,q,r} \end{array}\right) \middle/ d^2\right] \middle/ b_{p,q,r} \quad (5)$$

$$\epsilon = \frac{\text{real part of } \xi_{p,q,r}}{-\omega^2 \mu_0} \quad (6)$$

$$\sigma = \frac{\text{imaginary part of } \xi_{p,q,r}}{\omega \mu_0} \quad (7)$$

In Eqn. 5, the subscripts can be voxel indices, the b's can denote phasor representations of true $B_1^+$ values, and the bracketed expression can be an example finite difference approximation (e.g., using a local region of size 2d×2d×2d) to applying Laplace's differential operator on $B_1^+$.

However, the true phase distribution of $B_1^+$ can be evasive and can be an obstacle for applying Eqn. 5-based property mapping in practice. In general, a $B_1^+$ map acquired by an existing MR-based $B_1^+$ mapping schemes can have its phase corrupted by an unknown phase distribution. In other words, the acquired $B_1^+$ map can be an unknown phase offset away from the true $B_1^+$:

$$B_1^+(x)=\hat{B}_1^+(x)e^{j\phi(x)} \quad (8)$$

where $\hat{B}_1^+(x)$ can represent the acquired $B_1^+$ map and $-\phi(x)$ can equal the unknown phase distribution.

Exemplary embodiments of the present disclosure can include a technique and/or a procedure that can employ multiple (albeit corrupted) measurements of RF transmit/receive fields to constrain and resolve the electrical property distributions. In an exemplary embodiment, parallel RF transmitters/receivers can be used to obtain the measurements. For a parallel transmit system, each of a plurality of true $B_1^+$ maps preferably satisfies Eqn 1. Further, in an exemplary implementation of the present disclosure employing a single coil for receive, a common unknown phase distribution (due to, e.g., the receive coil sensitivity's phase distribution and/or $B_0$ inhomogeneity) can be shared amongst the acquired $B_1^+$ maps when they are compared to the corresponding true $B_1^+$ maps. The N independent $B_1^+$ maps associated with an N-channel transmit MRI of a subject then can impose a key set of consistency constraints on $\xi(x)$:

$$\xi(x)(\hat{B}_1^{+(n)}(x)e^{j\phi(x)}) = \nabla^2(\hat{B}_1^{+(n)}(x)e^{j\phi(x)}) + \text{higher order terms, for } n=1,\ldots,N \quad (9)$$

where $-\phi(x)$ can equal the common unknown phase distribution.

Eqn. 9 indicates that the use of a parallel transmit system and the employment of a common phase correction can lead to a buildup of constraints. To which degree the constraints resolve the value of can be better appreciated from a discretized version of Eqn 9:

$$\xi_{p,q,r} = [(\hat{b}_{p+1,q,r}^{(n)} z_1 + \hat{b}_{p-1,q,r}^{(n)} z_2 + \hat{b}_{p,q+1,r}^{(n)} z_3 + \hat{b}_{p,q-1,r}^{(n)} z_4 + \hat{b}_{p,q,r+1}^{(n)} z_5 + \hat{b}_{p,q,r-1}^{(n)} z_6 - 6\hat{b}_{p,q,r}^{(n)})/d^2]/\hat{b}_{p,q,r}^{(n)} \quad (10)$$

where the $\hat{b}$'s can denote phasor representations of $B_1^+$ values acquired by MR and the z's can be ratios of unknown phase terms (e.g., $z_1 = \exp(j^*(\phi_{p+1,q,r} - \phi_{p,q,r})), \ldots$). For each voxel, Eqn 10 can represent a set of N equations in 7 unknowns ($\xi$ and the z's), and each of the z's can be additionally constrained to be of unit modulus. This formulation can resemble a hyperplane fitting problem, and a singular value decomposition can offer a solution for $|\xi_{p,q,r} + 6/d^2|$. An exemplary result obtained by employing an embodiment of the present disclosure in an FDTD simulation can be shown, for example, in FIG. 1. More involved calculations leveraging the unit modulus constraints can be applied. This, for example, can take the form of a constrained least squares.

Because $\xi(x)$ can represent $(\sigma(x) + \sqrt{-1}\omega\epsilon(x))\sqrt{-1}\omega\mu(x)$, a map of $|\xi_{p,q,r} + 6/d^2|$ can capture conductivity and permittivity variations within the scanned object. This can provide noninvasive detection/characterization of pathology of the scanned object.

The concept of pooling equations that can constrain and resolve electrical property distributions can be integrated with other data acquisition schemes. In a further exemplary embodiment of the present disclosure, an expanded hardware setup where M parallel receive coils as well as N parallel transmit coils are available for use in MR scans can be used. In this embodiment, a single transmit coil (which can be one of the N transmit coils or one that is synthesized by combining several of the N transmit coils) and the M receive coils can be utilized to additionally acquire M number of MR images (e.g., one from each of the receive coil) that can differ in individual receive coil sensitivity profiles ($B_1^{-(m)}$): $\hat{S}^{(m)}(x) = S_0(x)B_1^{-(m)}(x)$, or, $$B_1^{-(m)}(x) = \frac{1}{S_0(x)}\hat{S}^{(m)}(s) \quad (11)$$

where $\hat{S}^{(m)}$ can denote the MR images. Eqn. 11 indicates that the acquired MR images $\hat{S}^{(m)}$ can be a common complex-valued scaling factor away from the true $B_1^{-(m)}$.

Using a complex conjugate version of Eqn. 1, and following a similar derivation that led to Eqn. 9, it can be shown that $$\xi(x)(\text{conjugate}(\hat{S}^{(m)}(x))w(x)) = \nabla^2(\text{conjugate}(\hat{S}^{(m)}(x))w(x)) + \text{higher order terms, for } m=1,\ldots,M \quad (12)$$

where $w(x)$ can denote conjugate($1/S_0(x)$). A discretized version of Eqn. 12 can be:

$$\xi_{p,q,r} = [(\hat{s}_{p+1,q,r}^{(m)} y_1 + \hat{s}_{p-1,q,r}^{(m)} y_2 + \hat{s}_{p,q+1,r}^{(m)} y_3 + \hat{s}_{p,q-1,r}^{(m)} y_4 + \hat{s}_{p,q,r+1}^{(m)} y_5 + \hat{s}_{p,q,r-1}^{(m)} y_6 - 6\hat{s}_{p,q,r}^{(m)})/d^2]/\hat{s}_{p,q,r}^{(m)} \quad (13)$$

where the $\hat{s}$'s can denote complex conjugate of MR image values and the y's can be ratios of unknown scaling terms (e.g., $y_1 = w_{p+1,q,r}/w_{p,q,r}, \ldots$). For each voxel, Eqn. 13 can represent a set of M equations in 7 unknowns (e.g., $\xi$ and the y's). The constraints represented by Eqn. 13 can augment those represented by Eqn. 10, allowing further determination of both the real and imaginary components of $\xi_{p,q,r}$ and, subsequently, the conductivity and permittivity maps (see Eqns. 6 and 7). Eqn. 10 is capable of determining $|\xi_{p,q,r} + 6/d^2|$, which can address a limitation associated with Eqn. 13's lack of magnitude constraints on the y's when used alone. However, Eqn. 10 by itself typically cannot resolve the phase of $\xi_{p,q,r} + 6/d^2$. This limitation can be addressed with the incorporation of Eqn. 13.

Additionally, alternative exemplary hardware configuration and/or MR acquisitions schemes can be used to obtain multiple measurements of RF transmit/receive fields. Exemplary setups can include a plurality of RF current-inducing leads which can be positioned at a set of locations, an RF coil or RF current-inducing lead which can be sequentially placed at set of locations, and a passive, field-altering object which can be sequentially placed at a set of locations.

FIG. 1 shows an illustration of an exemplary simulation utilizing data that simulated MR-based RF transmit field measurements and utilized an exemplary embodiment of the present disclosure to create an electrical property map. For example, the exemplary object 100 contained four materials of different electrical properties. The exemplary hardware included 32 parallel RF transmit/receive coils operating at 298 MHz (7T MRI). The exemplary $|\xi_{p,q,r} + 6/d^2|$ map 101 over an exemplary slice showing the four materials and an electrical property-based contrast.

FIG. 2 shows a block diagram of an exemplary embodiment of a system according to the present disclosure. For example, exemplary procedures in accordance with the present disclosure described herein can be performed using transmitters 122 (TX 1 through TX N), receivers 124 (RX 1 through RX N), MRI system 126, and a processing arrangement and/or a computing arrangement 102. Such processing/computing arrangement 102 can be, e.g., entirely or a part of, or include, but not limited to, a computer/processor 104 that can include, e.g., one or more microprocessors, and use instructions stored on a computer-accessible medium (e.g., RAM, ROM, hard drive, or other storage device).

As shown in FIG. 2, e.g., a computer-accessible medium 106 (e.g., as described herein above, a storage device such as a hard disk, floppy disk, memory stick, CD-ROM, RAM, ROM, etc., or a collection thereof) can be provided (e.g., in communication with the processing arrangement 102). The computer-accessible medium 106 can contain executable instructions 108 thereon. In addition or alternatively, a storage arrangement 110 can be provided separately from the computer-accessible medium 106, which can provide the instructions to the processing arrangement 102 so as to configure the processing arrangement to execute certain exemplary procedures, processes and methods, as described herein above, for example.

Further, the exemplary processing arrangement 102 can be provided with or include an input/output arrangement 114, which can include, e.g., a wired network, a wireless network, the internet, an intranet, a data collection probe, a sensor, etc. As shown in FIG. 2, the exemplary processing arrangement 102 can be in communication with an exemplary display arrangement 112, which, according to certain exemplary embodiments of the present disclosure, can be a touch-screen configured for inputting information to the processing arrangement in addition to outputting information from the processing arrangement, for example. Further, the exemplary display 112 and/or a storage arrangement 110 can be used to display and/or store data in a user-accessible format and/or user-readable format.

Figure 3:
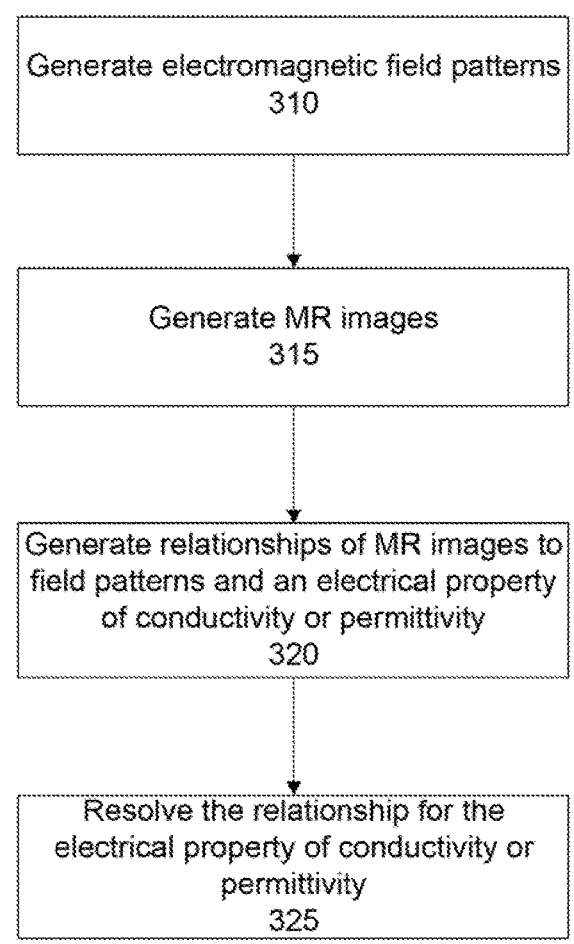
FIG. 3 is a flow diagram of an exemplary embodiment of an exemplary procedure according to the present disclosure.

FIG. 3 illustrates an exemplary procedure according to an exemplary embodiment of the present disclosure. The exemplary procedure of FIG. 3 can generate a plurality of electromagnetic field patters at 310, e.g., using at least one transmit coil. These can be from a plurality of generators (e.g., transmitting coil) or one generator that is repositioned (e.g., over time). At 315, the exemplary procedure can generate a plurality of MR images, which can include at least a magnitude or a phase associated with the generated electromagnetic field patterns. Next, at 320, the exemplary procedure can generate a plurality of relationships relating the MR images to the electromagnetic field patterns and to at least one electrical property of a target object. Finally, at 325, the exemplary procedure can resolve the relationship for the electrical property.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. In addition, all publications and references referred to above can be incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it can be explicitly being incorporated herein in its entirety.

What is claimed is:

1. An assembly that determines at least one of a conductivity or a permittivity of an object, comprising:
    at least one transmitter configured to generate a plurality of electromagnetic field distribution patterns directed at an object; and
    a data apparatus, including:
    a magnetic resonance (MR) imaging apparatus configured to produce at least two MR images of the object using at least one of a magnitude or a phase modulated by the electromagnetic field distribution patterns; and
    a hardware processing arrangement configured to determine the at least one of the conductivity or the permittivity of the object from the at least two produced MR images of the object.

2. The assembly of claim 1 wherein the at least one transmitter includes at least one radio frequency ("RF") coil.

3. The assembly of claim 2, wherein the at least one RF coil includes at least one of a plurality of RF coils (i) disposed at a plurality of locations (ii) sequentially disposed at a plurality of locations.

4. The assembly of claim 2, wherein the at least one RF coil includes at least one RF transmit coil and at least one RF receive coil.

5. The assembly of claim 1, wherein the at least one transmitter includes at least one of a plurality of RF current-inducing leads (i) disposed at a plurality of locations or (ii) sequentially disposed at a plurality of locations.

6. The assembly of claim 1, wherein the at least one transmitter includes a plurality of passive field-altering object sequentially placed at a plurality of locations.

7. The assembly of claim 1, wherein the hardware processing arrangement is further configured to resolve relationships for the at least one of the conductivity or the permittivity of the object from the at least two produced images.

8. A method of mapping at least one of a conductivity or a permittivity of an object, comprising:
    generating a plurality of electromagnetic field patterns using a magnetic resonance (MR) arrangement;
    generating a plurality of MR images with the MR arrangement and the MR images having at least one of a magnitude or a phase associated with the generated electromagnetic field patterns;
    generating, with a hardware processing arrangement, a plurality of relationships relating the generated MR images to (i) the generated electromagnetic field patterns, and (ii) the at least one of the conductivity or the permittivity of the object;
    resolving with the hardware processing arrangement, the relationships for the at least one of the conductivity or the permittivity from the generated MR images, and
    mapping with the hardware processing arrangement, the at least one of the conductivity or the permittivity of the object from the resolved relationships.

9. The method of claim 8, wherein the generation of electromagnetic field patterns is performed using at least one transmitter that includes at least one radio frequency ("RF") coil.

10. The method of claim 9, wherein the at least one RF coil includes at least one of a plurality of RF coils (i) disposed at a plurality of locations (ii) sequentially disposed at a plurality of locations.

11. The method of claim 9, wherein the at least one RF coil includes at least one RF transmit coil and at least one RF receive coil.

12. The method of claim 8, wherein the generation of electromagnetic field patterns is performed using at least one transmitter that includes at least one of a plurality of radio-frequency ("RF") current-inducing leads disposed (i) at a plurality of locations or (ii) sequentially disposed at a plurality of locations.

13. The method of claim 8, wherein the generation of electromagnetic field patterns is performed with at least one transmitter that includes a plurality of passive field-altering objects sequentially placed at a plurality of locations.

14. A non-transitory computer readable medium having stored thereon computer-executable instructions that determines at least one of a conductivity or a permittivity of an object, wherein, when a computer arrangement executes the instructions, the computer arrangement is configured to perform procedures comprising:

generating a plurality of magnetic resonance ("MR") images with at least one of a magnitude or a phase associated with previously generated electromagnetic field patterns;

generating a plurality of relationships relating the generated MR images to the previously generated electromagnetic field patterns, and to the at least one of the conductivity or the permittivity of the object;

resolving the relationships for the at least one of the conductivity or the permittivity from the generated MR images; and determining the at least one of the conductivity or the permittivity of an object; and storing the at least one of the conductivity or the permittivity in a storage device.

15. The non-transitory computer readable medium of claim 14, wherein the generation of electromagnetic field patterns is performed using at least one transmitter that includes at least one radio frequency ("RF") coil.

16. The non-transitory computer readable medium of claim 15, wherein the at least one RF coil includes at least one of a plurality of RF coils (i) disposed at a plurality of locations, (ii) sequentially disposed at a plurality of locations.

17. The non-transitory computer readable medium of claim 15, wherein the at least one RF coil includes at least one RF transmit coil and at least one RF receive coil.

18. The non-transitory computer readable medium of claim 14, wherein the generation of electromagnetic field patterns is performed using at least one transmitter that includes at least one of a plurality of radio-frequency ("RF") current-inducing leads disposed .(j). at a plurality of locations or an RF current inducing lead (ii) sequentially disposed at a plurality of locations.

19. The non-transitory computer readable medium of claim 14, wherein the generation of electromagnetic field patterns is performed with at least one transmitter that includes a plurality of passive field-altering objects sequentially placed at a plurality of locations.

\* \* \* \* \*